(12) United States Patent
Orsillo

(10) Patent No.: US 7,389,572 B2
(45) Date of Patent: *Jun. 24, 2008

(54) METHOD OF RETROFITTING A PROBE STATION

(76) Inventor: James E. Orsillo, P.O. Box 856, Bend, OR (US) 97708

( * ) Notice: Subject to any disclaimer, the term of this patent is extended or adjusted under 35 U.S.C. 154(b) by 625 days.

This patent is subject to a terminal disclaimer.

(21) Appl. No.: 10/432,808

(22) PCT Filed: Sep. 14, 2001

(86) PCT No.: PCT/US01/28669

§ 371 (c)(1), (2), (4) Date: May 23, 2003

(87) PCT Pub. No.: WO02/22303

PCT Pub. Date: Mar. 21, 2002

(65) Prior Publication Data

US 2005/0071974 A1 Apr. 7, 2005

(51) Int. Cl.
*B23P 17/04* (2006.01)
*G01R 31/02* (2006.01)
(52) U.S. Cl. ............... 29/401.1; 29/402.09; 324/758
(58) Field of Classification Search .............. 29/401.1, 29/402.04, 402.06, 402.08, 402.09, 402.14, 29/402.15; 324/754, 758
See application file for complete search history.

(56) References Cited

U.S. PATENT DOCUMENTS

| | | | |
|---|---|---|---|
| 5,220,279 A | 6/1993 | Nagasawa | |
| 5,264,787 A | 11/1993 | Woith et al. | |
| 5,410,259 A | 4/1995 | Fujihara et al. | |
| 5,528,158 A | 6/1996 | Sinsheimer et al. | |
| 5,552,701 A * | 9/1996 | Veteran et al. | 324/158.1 |
| 5,656,942 A | 8/1997 | Watts et al. | |
| 5,754,057 A | 5/1998 | Hama et al. | |
| 5,804,983 A | 9/1998 | Nakajima et al. | |
| 5,974,662 A | 11/1999 | Eldridge et al. | |

(Continued)

FOREIGN PATENT DOCUMENTS

EP 0699 913 A2 3/1996

(Continued)

OTHER PUBLICATIONS

European Search Report for European Application No. 1970934.4, dated Mar. 15, 2006.

*Primary Examiner*—Essama Omgba
(74) *Attorney, Agent, or Firm*—Klarquist Sparkman, LLP

(57) ABSTRACT

A method of retrofitting a probe station having a head plate (12), so that the probe station (10) is adapted to mate with a predetermined probe card dish (16) and any tester (18) out of a set of testers. A depression is then machined into the head plate to create a head plate-tooling plate attachment region. Next, fastening and alignment items are provided and installed in this region. Further, a set of tooling plates (110) are provided, each having fastening and alignment items adapted to mate to the fastening and alignment items on the attachment regions and defining an aperture designed to engage the predetermined probe card dish. The user may then select a desired one of the tooling plates and mate and fasten the selected tooling plate to the head plate-tooling plate attachment region using the alignment and fastening items.

27 Claims, 5 Drawing Sheets

U.S. PATENT DOCUMENTS

| | | | |
|---|---|---|---|
| 6,040,700 A | 3/2000 | Berar | |
| 6,060,892 A | 5/2000 | Yamagata | |
| 6,114,869 A | 9/2000 | Williams et al. | |
| 6,154,040 A * | 11/2000 | Tsukamoto et al. | 324/755 |
| 6,166,553 A | 12/2000 | Sinsheimer | |
| 6,252,414 B1 * | 6/2001 | Boyette et al. | 324/758 |
| 6,271,658 B1 | 8/2001 | Vallinan et al. | |
| 6,304,092 B1 | 10/2001 | Jordan | |
| 6,407,541 B1 * | 6/2002 | Hannan et al. | 324/158.1 |
| 6,408,500 B1 * | 6/2002 | Orsillo | 29/401.1 |
| 6,563,330 B1 * | 5/2003 | Maruyama et al. | 324/754 |
| 6,653,853 B1 * | 11/2003 | Cheng | 324/754 |
| 6,813,817 B2 * | 11/2004 | Orsillo | 29/401.1 |
| 6,839,948 B2 * | 1/2005 | Orsillo | 29/281.6 |
| 6,844,718 B2 * | 1/2005 | Heigl | 324/158.1 |
| 6,870,362 B2 * | 3/2005 | Thurmaier | 324/158.1 |
| 6,876,215 B1 * | 4/2005 | Hannan et al. | 324/758 |
| 6,925,699 B1 * | 8/2005 | Orsillo | 29/593 |
| 6,927,587 B2 * | 8/2005 | Yoshioka | 324/754 |
| 2002/0050042 A1 * | 5/2002 | Orsillo | 29/401.1 |
| 2003/0164717 A1 * | 9/2003 | Orsillo | 324/758 |
| 2004/0227532 A1 * | 11/2004 | Orsillo | 324/754 |
| 2004/0239353 A1 * | 12/2004 | Gudin et al. | 324/758 |
| 2006/0132154 A1 * | 6/2006 | Uher et al. | 324/754 |
| 2007/0007979 A1 * | 1/2007 | Noguchi | 324/754 |

FOREIGN PATENT DOCUMENTS

| | | |
|---|---|---|
| JP | 05144892 | 6/1993 |
| WO | WO 96/30772 | 10/1996 |

* cited by examiner

METHOD OF RETROFITTING A PROBE STATION

TECHNICAL FIELD

In the semiconductor field, each set of wafers fabricated is typically performance tested, before they are diced into individual integrated circuits. FIGS. 1-4 show equipment that is used in this testing. Although these figures show an embodiment of the invention they also show some features that are shared with prior art systems. These features are referenced in this section to help explain the context of the invention.

To perform wafer testing a piece of equipment known as a probe station 10 has a head plate 12 (FIG. 3) that defines an original head plate aperture 14. The aperture supports a circular device known as a probe card dish 16, which in turn supports the probe card 17. A separate piece of equipment, known as a tester 18 having docking units 20, is lowered into mating position with respect to the probe station, the probe card dish and the probe card. Sometimes probe station 10 includes an obstacle, such as a wafer loader cover 19, that is too close to the original head plate aperture 14 to permit the docking of a particular tester 18.

INDUSTRIAL APPLICABILITY

The invention applies to the industry of etched semiconductor wafers, which are ultimately diced to produce individual integrated circuits.

BACKGROUND ART

Generally, a number of guides and associated docking equipment pieces are needed to successfully dock a tester to a probe station, a probe card dish and the wafer that the probe card dish supports. Probe stations are generally sold to semiconductor manufacturing facilities with this docking equipment already installed. Accordingly, when a new tester is purchased it is typically necessary to purchase a new probe station fitted with docking equipment to facilitate docking with the new tester. Unfortunately, the docking equipment, which is typically installed by the probe station vendor or a secondary source, generally permits docking to a single make of tester. The installation of docking equipment to permit the use of a different tester with the probe station is referred to in the industry as "hardware swap-out" and results in extensive use of technician time and equipment down time.

It is known to machine a single prober to accept a single tooling plate that permits docking to a desired tester. There appears, however, not to have been an effort in the prior art to produce a set of standardized tooling plates that could each be used on any one of a set of differing probe stations. As a result, only very limited flexibility was gained by this method.

Another issue facing semiconductor manufacturers is the lack of uniformity of head plate apertures, between the various commercial lines of probe stations. The unfortunate result is that there is currently no known technique for mating a probe station having a first head plate aperture size with a tester designed to mate with a prober having a second head plate aperture size.

DISCLOSURE OF THE INVENTION

In a first aspect, the present invention is a method of retrofitting a probe station having a head plate, so that the probe station is adapted to mate with a predetermined probe card dish and any tester out of a set of testers. A depression is machined into the head plate to create a head plate-tooling plate attachment region. Next, fastening and alignment items are provided and installed in this region. Further, a set of tooling plates is provided, each having fastening and alignment items adapted to mate to the fastening and alignment items on the attachment regions and defining an aperture designed to engage the predetermined probe card dish. The user may then select a desired one of the tooling plates and mate and fasten the selected tooling plate to the head plate-tooling plate attachment region using the alignment and fastening items.

In a second separate aspect, the present invention is a tooling plate for installation into a probe station. The plate comprises a rigid plate defining a major aperture and a set of peripheral apertures fitted with spring loaded, retained screws adapted to facilitate fastening to mating threaded holes.

In a third separate aspect, the present invention is a tooling plate for installation into a probe station, the plate comprising a rigid plate defining a major aperture and a set of dowel locator holes precisely set with respect to the location of the major aperture.

In a fourth separate aspect, the present invention is a method of retrofitting a probe station having a head plate that defines an original head plate major aperture, so that the probe station is adapted to mate with a predetermined probe card dish and a predetermined tester that the probe station could not mate with prior to being retrofitted. The method comprises the steps of machining a depression into the head plate to create a head plate-tooling plate attachment region. In addition, the head plate major aperture is enlarged and head plate-tooling plate attachment region fastening and alignment items are provided. Also provided is a tooling plate having tooling plate fastening and alignment items adapted to mate to the head plate-tooling plate attachment region fastening and alignment items and defining a tooling plate major aperture designed to engage the predetermined probe card dish and wherein the tooling plate major aperture is positioned relative to the tooling plate fastening and alignment items such that once the tooling plate is installed the tooling plate major aperture will not be coincident to the original head plate major aperture. Finally, the tooling plate is mated and fastened to the head plate-tooling plate attachment region, using the alignment and fastening items.

In a fifth separate aspect, a method of retrofitting a probe station having a head plate, so that it can mate with a tester that includes docking equipment that extends horizontally beyond the horizontal extent of the probe station. The method comprises machining at least one attachment region into the head plate and fitting the attachment region with alignment and fastening items and providing at least one docking equipment attachment plate, including a piece docking equipment, to mate to the attachment region. Then the docking equipment attachment plate is mated to the corresponding attachment region so that the docking equipment attachment plate protrudes horizontally outwardly from the head plate and supports the piece of docking equipment outwardly of the headplate.

In a sixth separate aspect, the present invention is a probe station capable of mating to a tester that has a larger footprint than the probe station. The probe station includes a headplate and at least one docking equipment supporting plate that extends outwardly from the headplate and supports at least one piece of docking equipment at a location distanced from the headplate.

In a seventh aspect, the present invention is a method of retrofitting a probe station having a head plate, so that the probe station is adapted to mate with a predetermined probe card dish and any tester out of a set of testers. Fastening and alignment items are provided and installed on the head plate. Further, a set of tooling plates is provided, each having fastening and alignment items adapted to mate to the fastening and alignment items on the head plate and defining an aperture designed to engage the predetermined probe card dish. The user may then select a desired one of the tooling plates and mate and fasten the selected tooling plate to the head plate using the alignment and fastening items.

The foregoing and other objectives, features and advantages of the invention will be more readily understood upon consideration of the following detailed description of the preferred embodiment(s), taken in conjunction with the accompanying drawings.

BEST MODES FOR CARRYING OUT THE INVENTION

Figure 3:
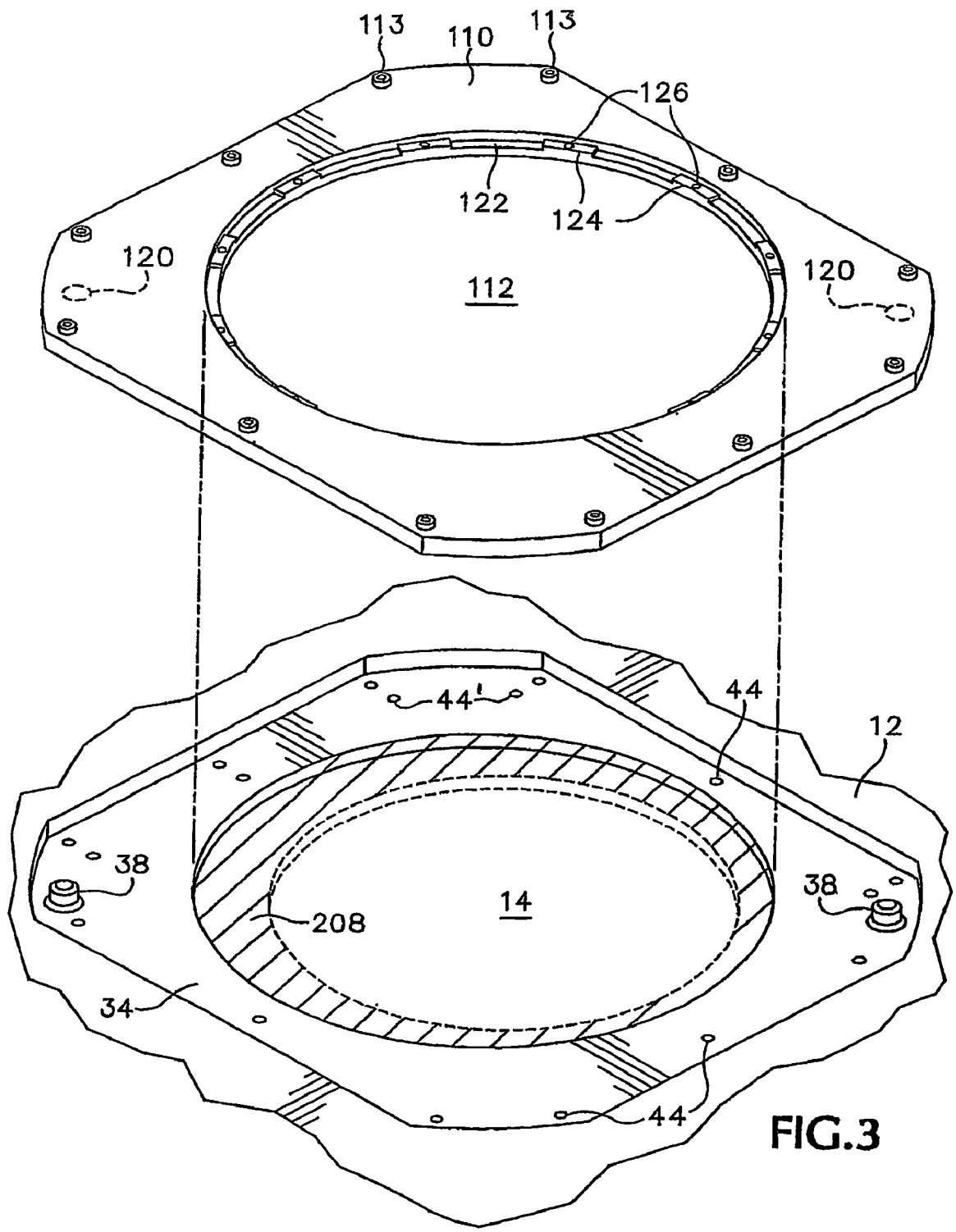
FIG. 3 is an exploded perspective view of a portion of the probe station of FIG. 1, showing some of the details of the retrofitting of the present invention.

To perform one preferred method of retrofitting a probe station according to the present invention, 0.3 mm (12 mils) of material is machined away from the top of the head plate 12 of the probe station 10 (both items have been introduced in the Background section) to form a head plate-tooling plate attachment region 34 (FIG. 3). A pair of through-holes (not shown) is drilled through the attachment region 34 of the head plate 12 to permit the attachment of a pair of dowel pins 38.

Figure 1:
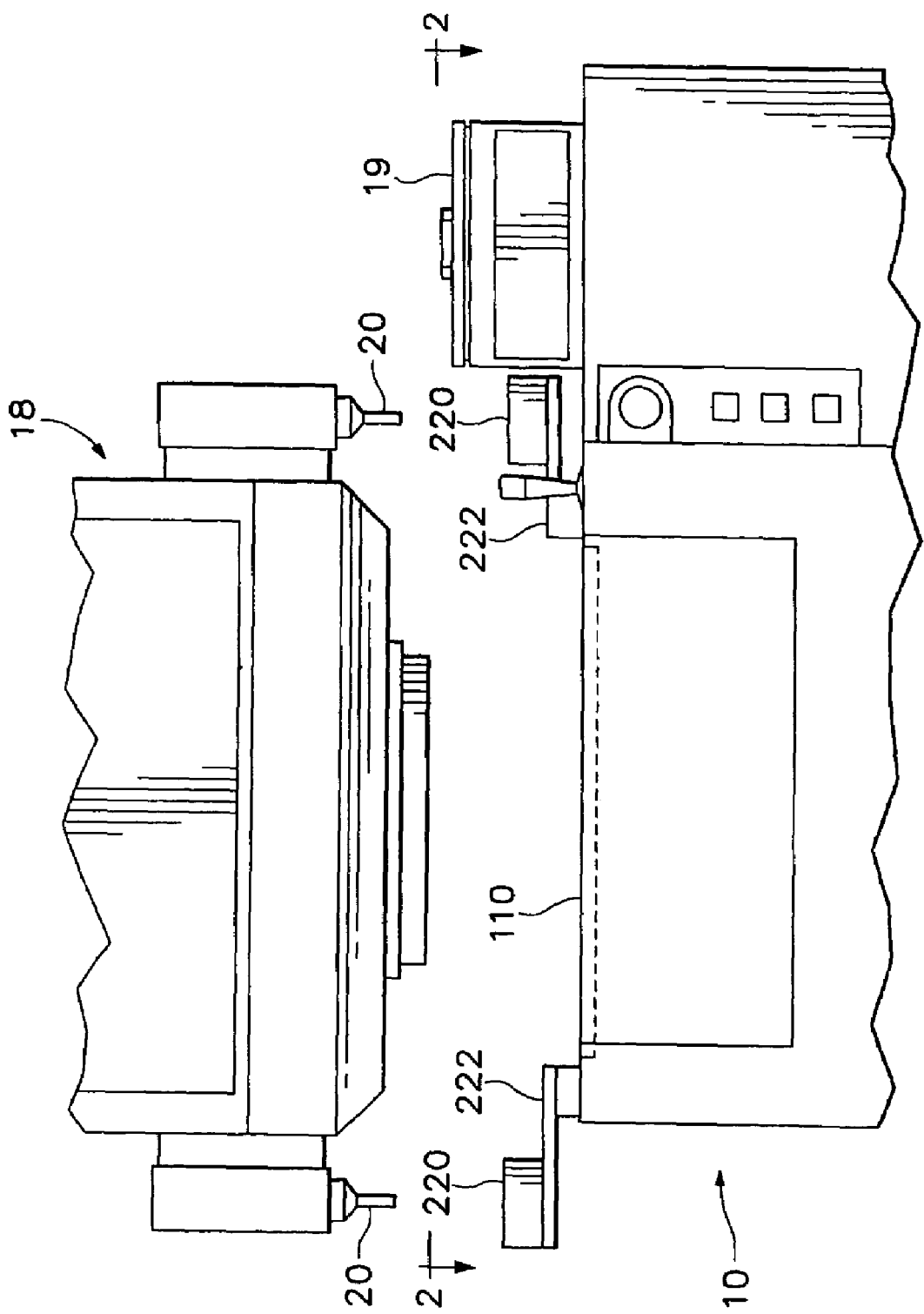
FIG. 1 is a side view of a probe station-tester mating pair wherein the probe station has been retrofitted according to the method of the present invention.
Figure 2:
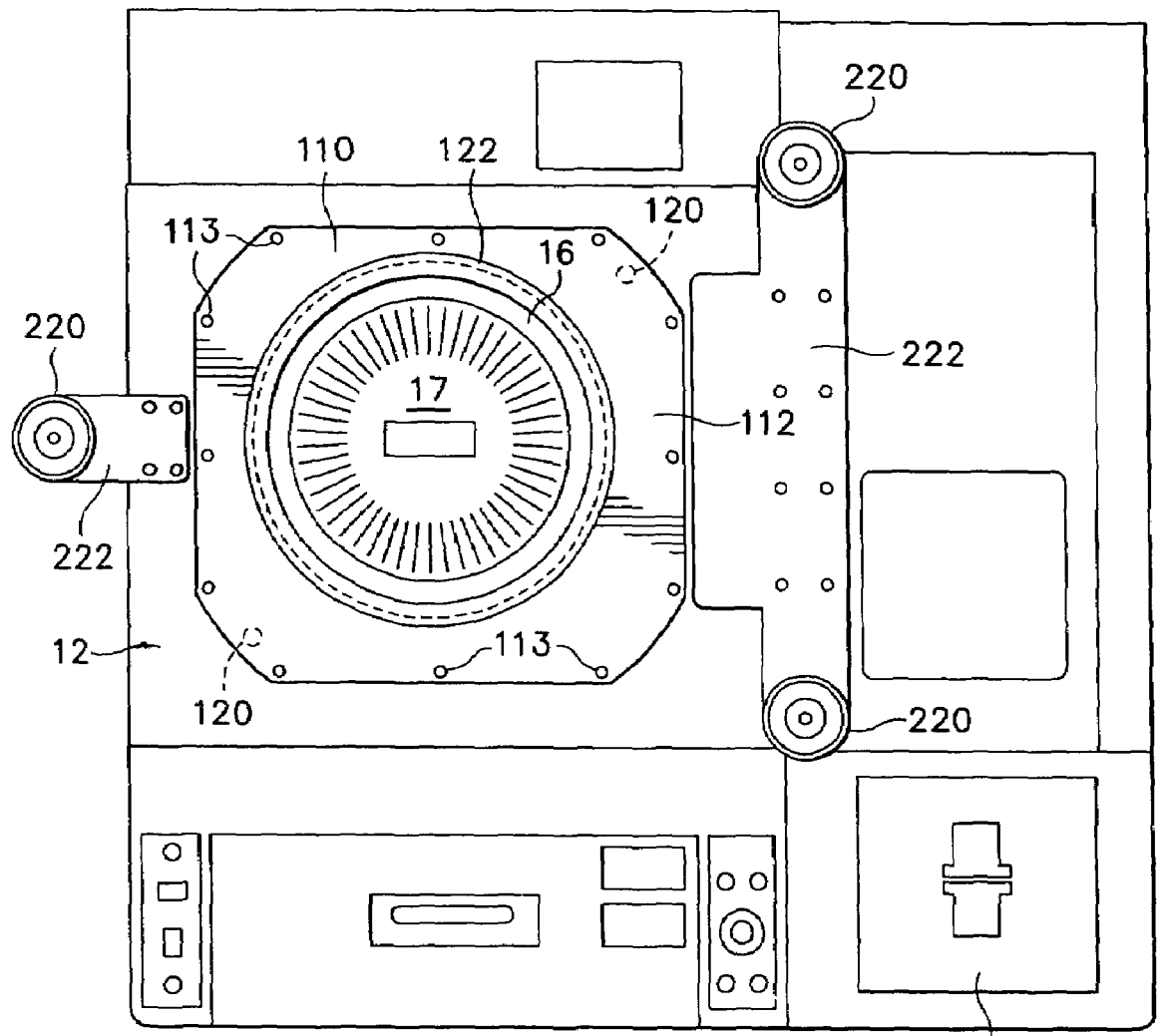
FIG. 2 is a top view of the probe station of FIG. 1.

In addition a sequence of threaded holes 44 are machined just inside the periphery of attachment region 34. The method of retrofitting a probe station that is the subject of the present invention is accomplished with the use of a tooling plate 110 as shown in FIGS. 1 and 2. Spring-loaded screws are set into a set of apertures 113, to permit the rapid attachment of plate 110 to a retrofitted probe station. The bottom side of plate 110 defines dowel pin locator holes 120, which are configured to mate with dowel pins 38 and thereby facilitate the precise positioning of plate 110. In one preferred embodiment the dowel pins 38 are sited with great precision relative to the center of aperture 14 to ensure correct alignment and positioning of a tooling plate 110.

Figure 4:
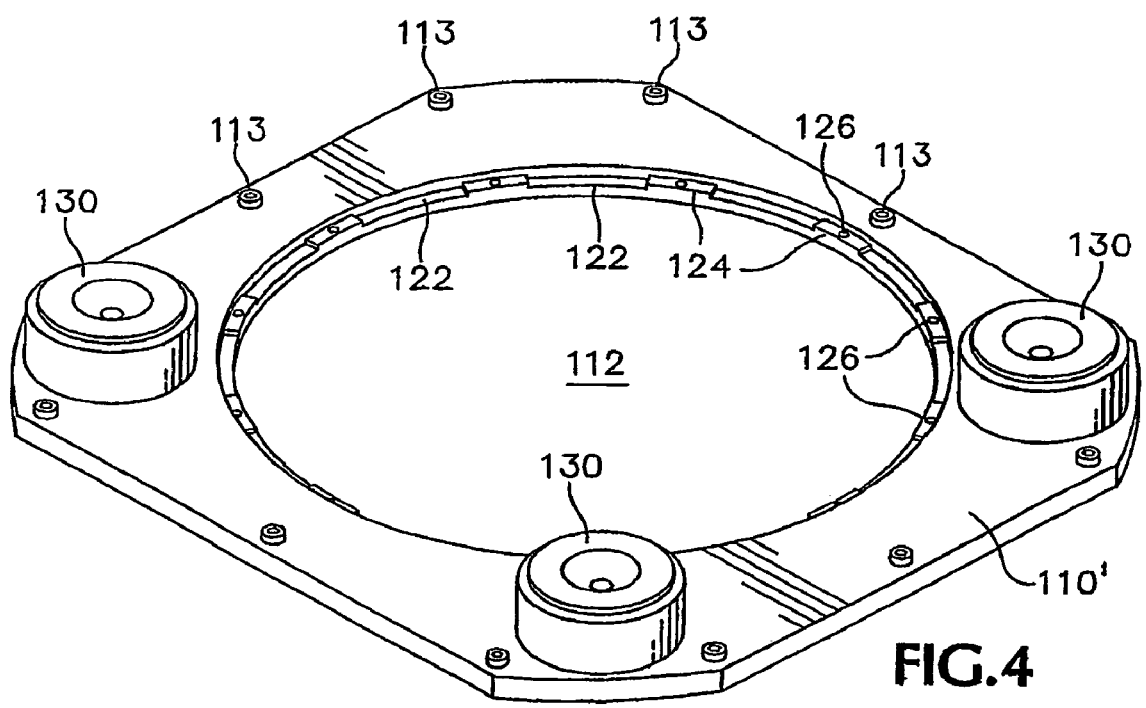
FIG. 4 is a perspective view of a tooling plate and docking equipment attached to the tooling plate.

The tooling plate 110, defines a tooling plate major aperture 112 for supporting a probe card dish. A rim 122, adapted for probe card dish attachment is defined about aperture 112. A set of bosses 124, each sunk with a threaded hole 126, ease the attachment of the probe card dish. Referring to FIG. 4, in some instances a set of docking equipment 130 is included as a part of an alternative tooling plate 110' so that the installation of plate 110' renders the probe station 10 ready to dock with a tester of choice 18.

Ideally, a number of tooling plates 110' could be provided, each one fitted with a distinct set of docking equipment 130 adapted to dock with a particular tester. In this manner, a semiconductor manufacturing facility that owns a number of testers and a number of probe stations could dock any one of a number of testers with any one of a number of probe stations. Moreover, if more than one probe station was retrofitted to accept any one out of a number of tooling plates 110', than any one of these testers could be placed in service with any probe station for which a matable plate 110' was available.

It should be expressly noted that by producing a set of tooling plates, each of which has a standardized set of location and attachment items, and by modifying a set of probe stations so that each one has a standardized set of location and attachment items designed to mate to the tooling plate location and attachment items, that a great flexibility can be achieved in the sense that any of the probe stations can be mated to any of the tooling plates and thereby to any tester for which such a tooling plate is available. This technique appears to be unknown in the prior art and can be applied even to probe stations of differing makes, such as the popular brands TSK®, TEL® and EG®.

In an alternative preferred embodiment, no depression is machined in head plate 12. Dowell pins 38 and threaded holes 44 are provided on the top surface of head plate 12 and a tooling plate 110 is attached on top of head plate 12.

In one preferred embodiment a second set of threaded holes 44' is provided in head plate attachment region 34 for the attachment of a smaller tooling plate 110. Such a smaller tooling plate 110 would typically be made to fit a probe station 10 having a smaller head plate. By providing the second set of threaded holes 44' a probe station 10 is made available for retrofitting with tooling plates 110 made primarily for a different line of probe stations 10 having smaller head plates 12.

Figure 5:
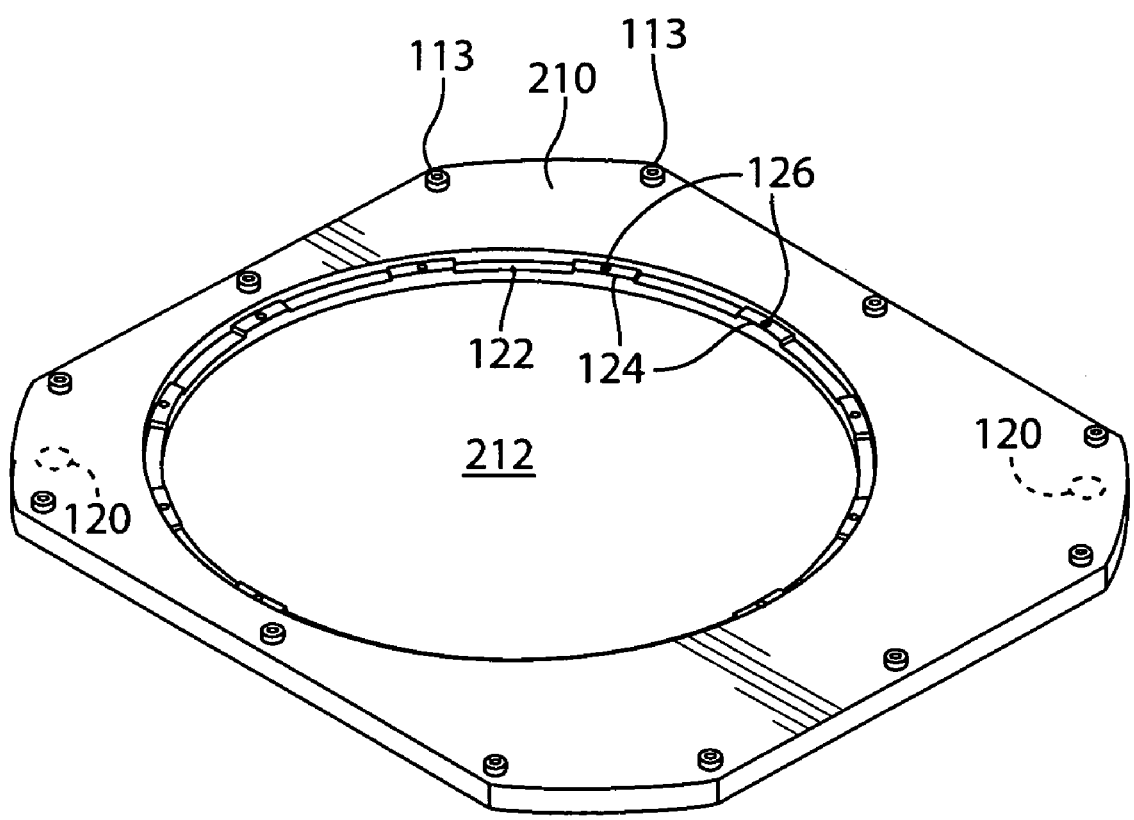
FIG. 5 is a perspective view of another embodiment of a tooling plate.

Referring again to FIGS. 1-2, in some instances, a probe station will have a head plate that is fairly small and will, further, have an obstacle 19 such as the cover for the device that loads the wafers onto the probe card dish (the "loader cover"). It may not be possible to dock this type of probe station to a tester without moving the probe card dish location away from the obstacle. To do this, the original head plate aperture 14 is enlarged by region 208 (FIG. 3), and a tooling plate 210 (FIG. 5) is provided having a major aperture 212 (FIG. 5) that is not centered with respect to the remainder of the tooling plate 210. When tooling plate 210 is installed the major aperture 212 is located differently from the original head plate major aperture 14 and is further away from the obstacle, thereby permitting a tester of choice to dock to tooling plate 210 without encountering the obstacle.

In this embodiment the docking equipment 220 is included on a set of docking equipment plates 222. To facilitate the correct attachment of plates 222 to head plate 12, head plate 12 is machined in similar manner to the machining of attachment region 34 but nearer to its edge to form docking equipment plate attachment regions (not shown) which would include location and attachment items such as threaded holes and dowel pins.

It should be noted that to successfully implement the embodiment shown in FIGS. 1 and 2, that the software that drives the tester and probe station must be adjusted to account for the difference in location between the tooling plate major aperture 212 and head plate original major aperture 14.

The terms and expressions which have been employed in the foregoing specification are used as terms of description and not of limitation, and there is no intention, in the use of such terms and expressions, of excluding, equivalents of the features shown and described or portions thereof, it being recognized that the scope of the invention is defined and limited only by the claims which follow.

The invention claimed is:

1. An apparatus for installation on the head plate of a probe station used in testing semiconductor devices, the apparatus comprising:
   a probe card dish and a probe card supported by the probe card dish;
   a removable tooling plate configured to be connectable to and completely disconnectable from the head plate of the probe station, the tooling plate having first and second opposed major surfaces, the tooling plate being formed with a major aperture in which the probe card dish is received; and
   docking equipment mounted to one of the first and second major surfaces, the docking equipment configured to facilitate docking of a tester to the probe station.

2. The apparatus of claim 1, wherein the tooling plate comprises a rim portion circumscribing the major aperture for supporting a probe card dish positioned in the major aperture.

3. The apparatus of claim 1, wherein the tooling plate comprises at least one fastening item for releasably mounting the tooling plate to the head plate of the probe station.

4. The apparatus of claim 1, wherein the tooling plate comprises at least one alignment hole dimensioned to receive a respective alignment pin on the head plate to facilitate alignment of the tooling plate on the head plate.

5. An apparatus for installation on the head plate of a probe station used in testing semiconductor devices, the apparatus comprising:
   a removable tooling plate configured to be connectable to and completely disconnectable from the head plate of the probe station, the tooling plate having first and second opposed major surfaces; and
   docking equipment mounted to one of the first and second major surfaces, the docking equipment configured to facilitate docking of a tester to the probe station;
   wherein the tooling plate comprises a major aperture and a rim portion circumscribing the major aperture for supporting a probe card dish positioned in the major aperture;
   wherein the rim portion comprises a plurality of circumferentially spaced bosses, each formed with a hole for receiving a fastener for coupling the probe card dish to the rim portion.

6. An apparatus for installation on the head plate of a probe station used in testing semiconductor devices, the apparatus comprising:
   a removable tooling plate configured to be connectable to and completely disconnectable from the head plate of the probe station, the tooling plate having first and second opposed major surfaces; and
   docking equipment mounted to one of the first and second major surfaces, the docking equipment configured to facilitate docking of a tester to the probe station;
   wherein the tooling plate comprises at least one fastening item for releasably mounting the tooling plate to the head plate of the probe station;
   wherein the at least one fastening item comprises at least one spring-loaded screw for tightening into a respective hole in the head plate.

7. A system for testing semiconductor devices, comprising:
   a probe card dish and a probe card supported by the probe card dish;
   a probe station having a head plate;
   a tester for docking with the probe station during testing of a semiconductor device;
   a tooling plate for supporting the probe card dish, the tooling plate adapted to couple to the head plate of the probe station and having first and second opposed major surfaces; and
   docking equipment mounted to one of the first and second major surfaces of the tooling plate, the docking equipment configured to facilitate docking of the tester to the probe station.

8. The system of claim 7, wherein the tester has docking equipment configured to mate with the docking equipment on the tooling plate.

9. The system of claim 7, wherein the head plate has a head plate aperture and a recessed area surrounding the head plate aperture for receiving the tooling plate.

10. The system of claim 7, wherein the tooling plate has at least one fastening item for releasably mounting the tooling plate to the head plate.

11. The system of claim 7, wherein the head plate has a head plate aperture and the tooling plate is formed with a major aperture dimensioned to receive the probe card dish, the major aperture of the tooling plate at least partially overlapping the head plate aperture so as to position the probe card dish for testing a semiconductor device in the probe station.

12. The system of claim 7, wherein the docking equipment comprises at least one piece of docking equipment adapted to mate with a piece of docking equipment on the tester.

13. The system of claim 7, wherein the head plate has at least one alignment pin and the tooling plate has at least one alignment hole for receiving the alignment pin to facilitate alignment of the tooling plate on the head plate.

14. A system for testing semiconductor devices, comprising:
   a probe station having a head plate;
   a tester for docking with the probe station during testing of a semiconductor device;
   a tooling plate for supporting a probe card dish, the tooling plate adapted to couple to the head plate of the probe station and having first and second opposed major surfaces; and
   docking equipment mounted to one of the first and second major surfaces of the tooling plate, the docking equipment configured to facilitate docking of the tester to the probe station;
   wherein the head plate has a head plate aperture and the tooling plate is formed with a major aperture dimensioned to receive the probe card dish, the major aperture of the tooling plate at least partially overlapping the head plate aperture so as to position the probe card dish for testing a semiconductor device in the probe station;
   wherein the major aperture of the tooling plate is off center from the head plate aperture.

15. A system for testing semiconductor devices, comprising:
   a probe station having a head plate;
   a tester for docking with the probe station during testing of a semiconductor device;
   a tooling plate for supporting a probe card dish, the tooling plate adapted to couple to the head plate of the probe station and having first and second opposed major surfaces; and
   docking equipment mounted to one of the first and second major surfaces of the tooling plate, the docking equipment configured to facilitate docking of the tester to the probe station;
   wherein the tooling plate comprises a major aperture for receiving a probe card dish, a rim portion circumscribing the aperture, and a plurality of circumferentially spaced bosses, each formed with a hole for receiving a fastener for coupling the probe card dish to the rim portion.

16. A method for using a probe station used in testing semiconductor devices, the method comprising:
positioning a first probe card dish in an aperture defined in a first tooling plate;
mounting first docking equipment to an upper surface of the tooling plate; and
mounting the tooling plate to an upper surface of a head plate of the probe station.

17. The method of claim 16, further comprising:
positioning a first semiconductor device in the probe station;
docking a first tester to the docking equipment on the tooling plate; and
testing the semiconductor device.

18. The method of claim 17, further comprising:
removing the first tooling plate from the head plate;
positioning a second probe card dish in an aperture defined in a second tooling plate;
mounting second docking equipment to an upper surface of the second tooling plate, the second docking equipment being different than the first docking equipment;
mounting the second tooling plate to the upper surface of the head plate;
docking a second tester to the second docking equipment;
positioning a second semiconductor device in the probe station; and
testing the second semiconductor device.

19. The method of claim 17, wherein docking a first tester to the docking equipment on the tooling plate comprises mating at least one piece of docking equipment on the tooling plate with a corresponding piece of docking equipment on the tester.

20. The method of claim 16, further comprising positioning the first tooling plate in a recess formed in the head plate of the probe station.

21. The method of claim 16, wherein mounting the tooling plate to an upper surface of the head plate of the probe station comprises aligning an alignment item on the tooling plate with a corresponding alignment item on the head plate of the probe station.

22. The method of claim 16, comprising mounting the tooling plate to an upper surface of the head plate of the probe station such that the aperture of the tooling plate at least partially overlaps an aperture in the head plate.

23. A method for using a probe station used in testing semiconductor devices, the method comprising:
mounting a first tooling plate to the head plate of a probe station;
positioning a probe card dish supporting a probe card in a first aperture in the tooling plate;
mounting first docking equipment to the tooling plate; and
docking a first tester to the docking equipment.

24. The method of claim 23, wherein the first aperture is off center from an aperture in the head plate.

25. The method of claim 23, wherein mounting a first tooling plate to the head plate of a probe station comprises mounting the first tooling plate in a recess in the head plate.

26. The method of claim 23, further comprising aligning the first tooling plate with alignment items on the head plate.

27. A method for using a probe station used in testing semiconductor devices, the method comprising:
mounting a first tooling plate to the head plate of a probe station;
mounting first docking equipment to the tooling plate;
docking a first tester to the docking equipment;
removing the first tooling plate from the head plate;
mounting a second tooling plate to the head plate;
mounting second docking equipment to the second tooling plate, the second docking equipment being adapted to dock a second tester that is different than the first tester; and
docking the second tester to the docking equipment.

* * * * *